United States Patent
Yasumori et al.

(10) Patent No.: US 8,848,460 B2
(45) Date of Patent: Sep. 30, 2014

(54) SEMICONDUCTOR DEVICE HAVING PLURAL DATA BUSES AND PLURAL BUFFER CIRCUITS CONNECTED TO DATA BUSES

(75) Inventors: Koji Yasumori, Tokyo (JP); Hisayuki Nagamine, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 218 days.

(21) Appl. No.: 13/420,105

(22) Filed: Mar. 14, 2012

(65) Prior Publication Data

US 2012/0243341 A1  Sep. 27, 2012

(30) Foreign Application Priority Data

Mar. 25, 2011  (JP) ................................. 2011-068358

(51) Int. Cl.
*G11C 7/10* (2006.01)
*G11C 11/4093* (2006.01)
*H01L 27/108* (2006.01)
*G11C 29/02* (2006.01)
*G11C 11/4097* (2006.01)
*G11C 11/401* (2006.01)

(52) U.S. Cl.
CPC ...... *G11C 11/4093* (2013.01); *H01L 27/10897* (2013.01); *G11C 29/028* (2013.01); *G11C 11/4097* (2013.01); *H01L 27/10882* (2013.01); *G11C 29/022* (2013.01); *G11C 11/401* (2013.01)

USPC .................. 365/189.05; 365/148; 365/189.14

(58) Field of Classification Search
CPC ............. G11C 11/401; G11C 11/4093; G11C 11/4097; G11C 29/022; H01L 27/10882; H01L 27/10897
USPC ................................ 365/189.05, 189.14, 148
See application file for complete search history.

(56) References Cited

U.S. PATENT DOCUMENTS

| 4,779,227 | A  | * | 10/1988 | Kurafuji et al. ................... 365/63 |
| 5,835,440 | A  | * | 11/1998 | Manning ................... 365/230.06 |
| 6,327,192 | B1 | * | 12/2001 | Lee ........................... 365/189.05 |
| 7,053,654 | B1 | * | 5/2006  | Young et al. ..................... 326/44 |
| 8,437,170 | B2 | * | 5/2013  | Fukano .......................... 365/148 |

FOREIGN PATENT DOCUMENTS

JP     2006-253270 A     9/2006

* cited by examiner

*Primary Examiner* — Pho M Luu
(74) *Attorney, Agent, or Firm* — Foley & Lardner LLP

(57) ABSTRACT

A plurality of buffer circuits and data buses coupled to the buffer circuits are included in a device. Each of the data buses includes first and second portions. The first portions of the data buses are arranged at a first pitch in the second direction, and the second portions of the data buses are arranged at a second pitch in the second direction, the second pitch being smaller than the first pitch.

19 Claims, 18 Drawing Sheets

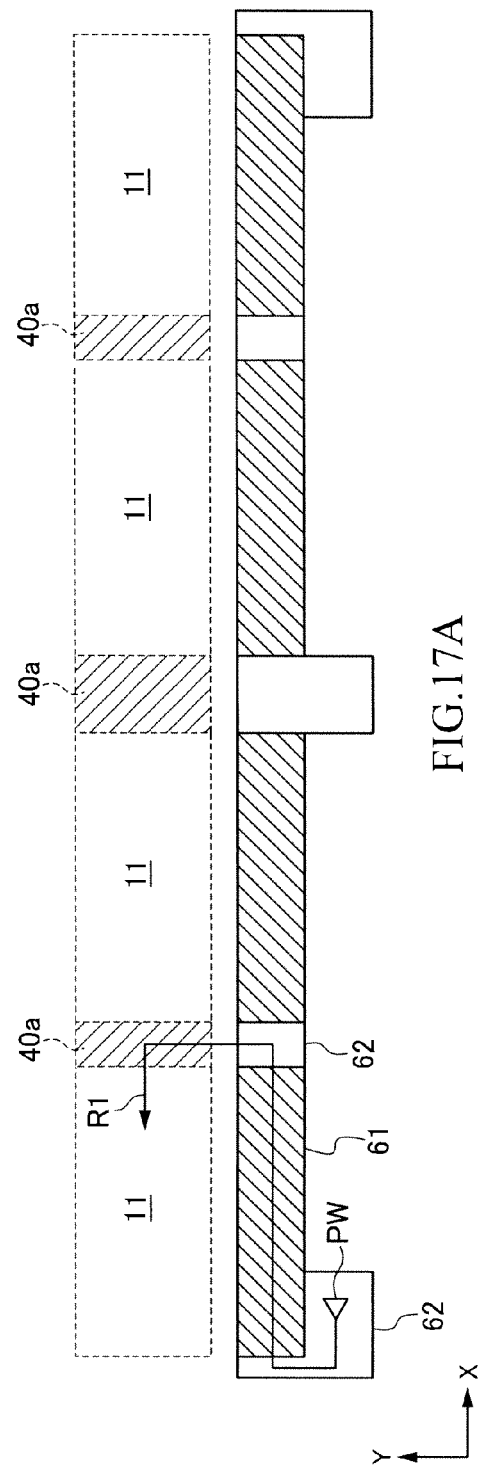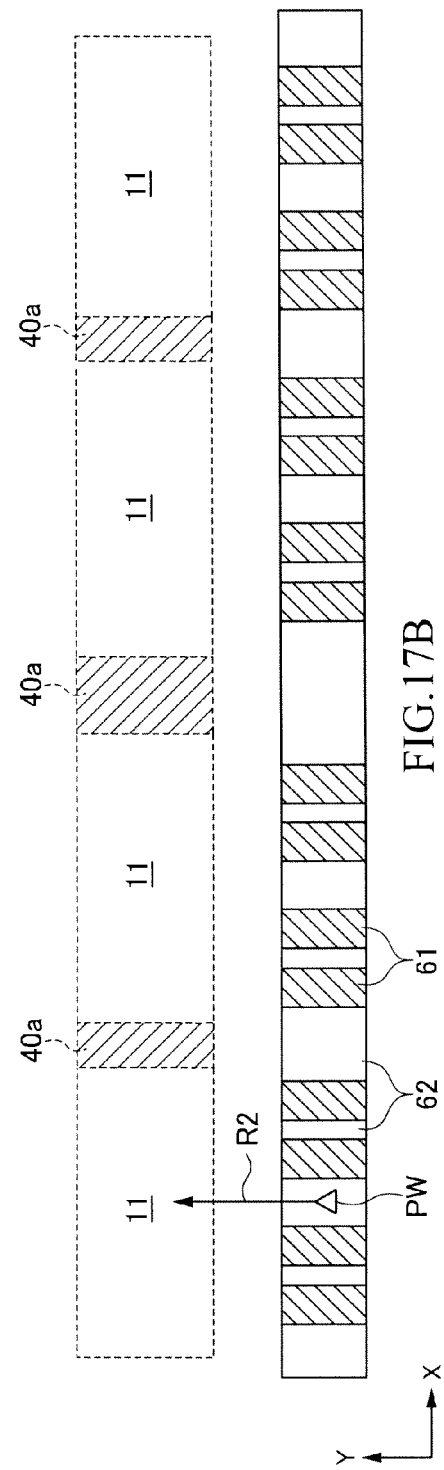
FIG.17A
FIG.17B

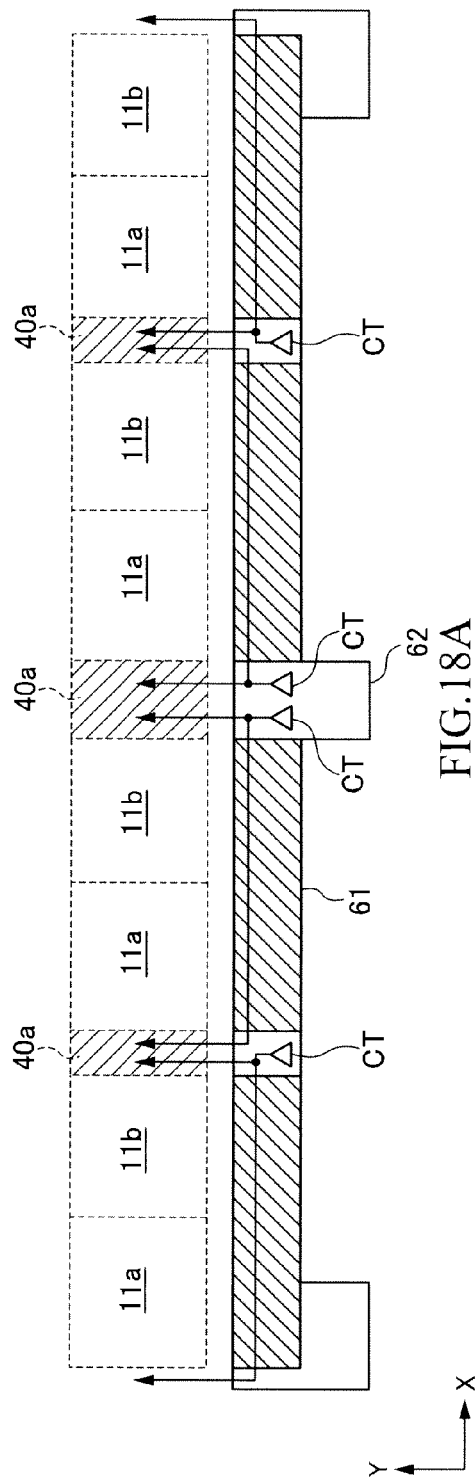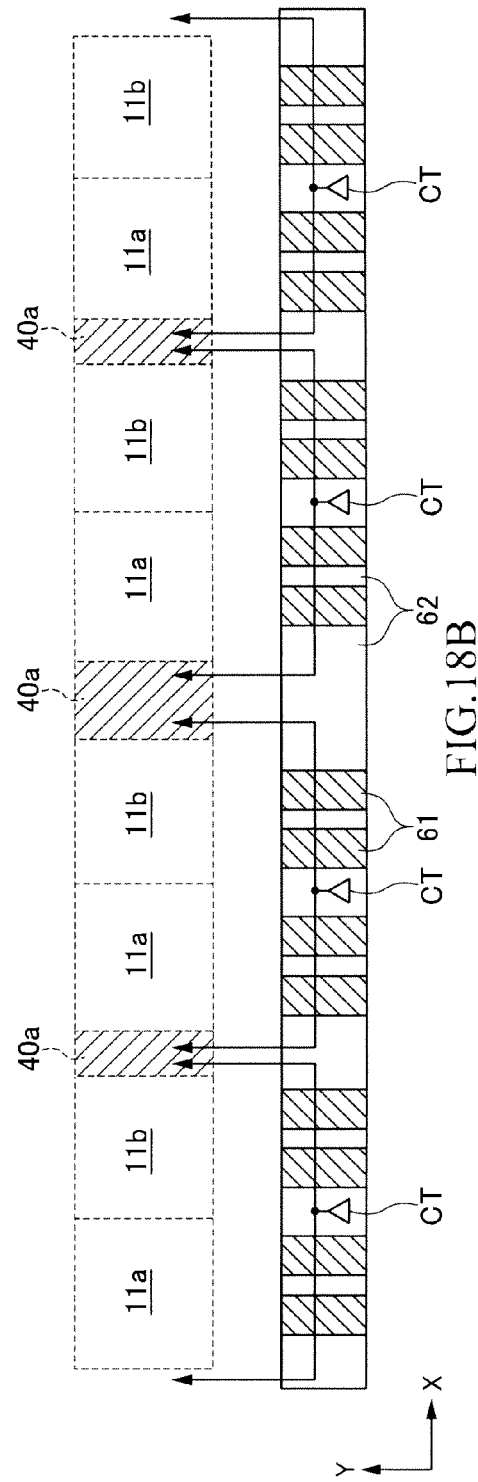

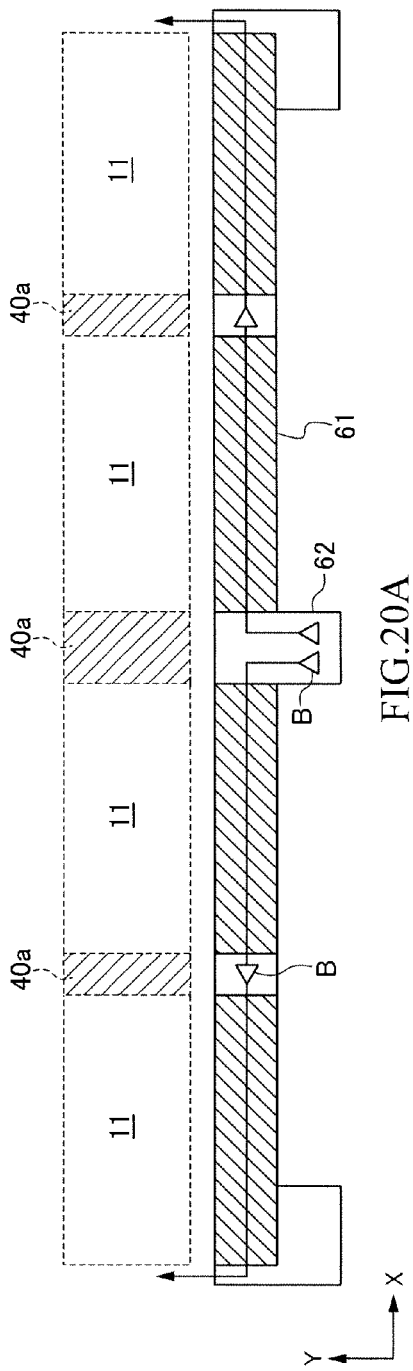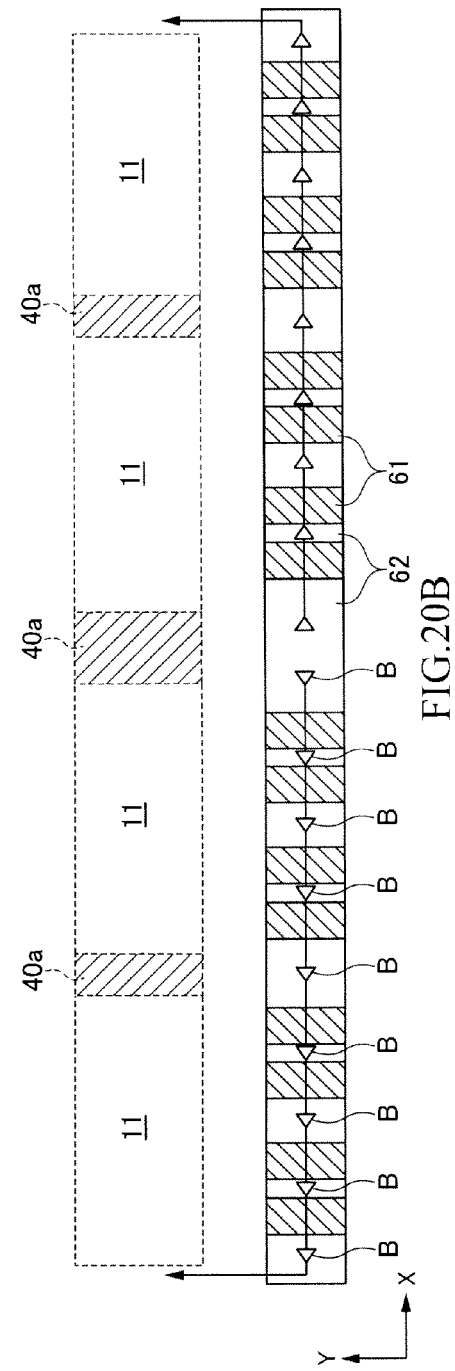

SEMICONDUCTOR DEVICE HAVING PLURAL DATA BUSES AND PLURAL BUFFER CIRCUITS CONNECTED TO DATA BUSES

This application is based on Japanese patent application no. 2011-068358, filed Mar. 25, 2011, the entire contents of which is incorporated herein by reference.

BACKGROUND OF THE INVENTION

1. Field of the Invention

The present invention relates to a semiconductor device, and more particularly to a semiconductor device having a plurality of data buses regularly arranged above a memory cell area.

2. Description of Related Art

A semiconductor memory device such as a DRAM (Dynamic Random Access Memory) has a memory cell area including many memory cells regularly arranged therein. A buffer area including a plurality of buffer circuits is placed near the memory cell area. The memory cells and the buffer circuits are connected through a plurality of data buses placed above the memory cell area. Because the many memory cells are regularly arranged in the memory cell area, the data buses are also regularly arranged (see Japanese Patent Application Laid-open No. 2006-253270).

The buffer circuits are connected to corresponding data buses, respectively, and thus the buffer circuits are also regularly arranged in general. For example, when an arrangement pitch of the buffer circuits is matched with an arrangement pitch of the data buses, the buffer circuits are arranged as extensions of the data bus, which achieves a simplest layout.

However, when the arrangement pitch of the buffer circuits is matched with the arrangement pitch of the data buses, layouts of other circuit blocks such as an internal voltage generating circuit are considerably limited. That is, because the memory cell area has an array area including many memory cells regularly arranged therein and a non-array area including a decoder and the like arranged therein, parts adjacent to the array area are all used as the buffer area when the arrangement pitch of the buffer circuits is matched with the arrangement pitch of the data buses. Accordingly, there is no choice but to arrange circuit blocks such as the internal voltage generating circuit adjacently to the non-array area, which causes a shortage of areas to be allocated to these circuit blocks. To compensate this situation, it is necessary to increase widths of the circuit blocks such as the internal voltage generating circuit and to deform a formation area thereof. In this case, a useless free space is produced due to a difference in width between the buffer area and the circuit blocks, resulting in increase in a chip area.

In another embodiment, such a semiconductor device is derived that includes: a plurality of buffer circuits each including first and second circuit nodes that are disposed substantially in line in a first direction; a plurality of first signal lines arranged at a first pitch in a second direction that is substantially perpendicular to the first direction, each of the first signal lines being elongated from the first circuit node of an associated one of the buffer circuits and running in the first direction on a side opposite to the second circuit node; a plurality of second signal lines arranged at the first pitch in the second direction, each of the second signal lines being elongated from the second circuit node of an associated one of the buffer circuits and running in the first direction on a side opposite to the first circuit node; a plurality of third signal lines arranged at a second pitch in the second direction, the second pitch being greater than the first pitch, each of the third signal lines running in the first direction; and a plurality of fourth signals each disposed between an associated one of the second signal lines and an associated one of the third signal lines to connect the associated one of the second signal lines and the associated one of the third signal lines to each other.

SUMMARY

In one embodiment, there is provided a semiconductor device that includes: a plurality of data buses each extending in a first direction; a memory cell area having a first side extending in a second direction different from the first direction; and a buffer area located along the first side of the memory cell area, the buffer area including a plurality of buffer circuits each connected to an associated one of the data buses. Each of the data buses has a first portion located over the memory cell area and a second portion located over the buffer area. The first portions of the data buses are arranged at a first pitch in the second direction. The second portions of the data buses are arranged at a second pitch in the second direction. The second pitch is smaller than the first pitch.

BRIEF DESCRIPTION OF THE DRAWINGS

FIG. 17A is a schematic diagram indicative of a layout of the prototype;

FIG. 17B is a schematic diagram for explaining another effect according to the embodiment;

FIG. 18A is a schematic diagram indicative of a layout of the prototype;

FIG. 18B is a schematic diagram for explaining still another effect according to the embodiment;

FIG. 20A is a schematic diagram indicative of a layout of the prototype; and

FIG. 20B is a schematic diagram for explaining still another effect according to the embodiment.

DETAILED DESCRIPTION OF THE EMBODIMENTS

Preferred embodiments of the present invention will be explained below in detail with reference to the accompanying drawings.

Figure 1:
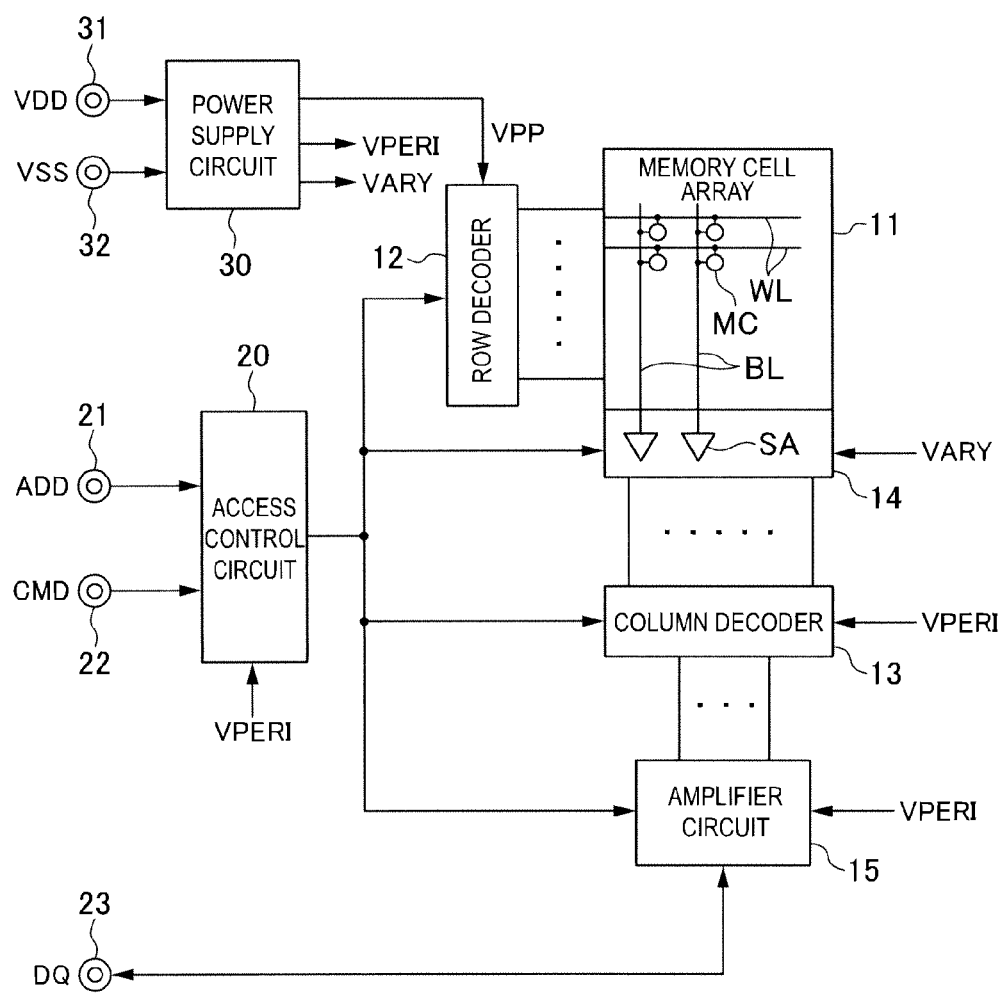
FIG. 1 is a block diagram indicative of a general configuration of a semiconductor device 10 according to an embodiment of the present invention.

Referring now to FIG. 1, the semiconductor device 10 according to the present embodiment is a DRAM and includes a memory cell array 11 as shown in FIG. 1. The memory cell array 11 includes a plurality of word lines WL and a plurality of bit lines BL intersecting with each other, and a memory cell MC is placed at each intersection. Selection of the word line WL is performed by a row decoder 12 and selection of a bit line BL is performed by a column decoder 13. The bit lines BL are connected to corresponding sense amplifiers SA in a sense circuit 14, respectively. A bit line BL selected by the column decoder 13 is connected to an amplifier circuit 15 via the corresponding sense amplifier SA.

Operations of the row decoder 12, the column decoder 13, the sense circuit 14, and the amplifier circuit 15 are controlled by an access control circuit 20. An address signal ADD and a command signal CMD are supplied to the access control circuit 20 from outside through an address terminal 21 and a command terminal 22, respectively. The access control circuit 20 receives the address signal ADD and the command signal CMD, and controls the row decoder 12, the column decoder 13, the sense circuit 14, and the amplifier circuit 15 based on these signals.

Specifically, when the command signal CMD indicates an active operation of the semiconductor device 10, the address signal ADD is supplied to the row decoder 12. In response to this supply, the row decoder 12 selects a word line WL indicated by the address signal ADD, which connects corresponding memory cells MC to the bit lines BL, respectively. The access control circuit 20 then activates the sense circuit 14 at a predetermined timing.

On the other hand, when the command signal CMD indicates a read operation or a write operation of the semiconductor device 10, the address signal ADD is supplied to the column decoder 13. In response to this supply, the column decoder 13 connects a bit line BL indicated by the address signal ADD to the amplifier circuit 15. Accordingly, during the read operation, read data DQ read from the memory cell array 11 via the sense amplifier SA are output to the outside through a data terminal 23 via the amplifier circuit 15. During the write operation, write data DQ supplied from the outside through the data terminal 23 are written to the memory cells MC via the amplifier circuit 15 and the sense amplifier SA.

These circuit blocks use predetermined internal voltages as operation powers, respectively. These internal voltages are generated by a power supply circuit 30 shown in FIG. 1. The power supply circuit 30 receives an external potential VDD and a ground potential VSS supplied through power supply terminals 31 and 32, respectively, and generates internal voltages VPP, VPERI, VARY, and the like based on these potentials. In the present specification, VDD, VPP, VPERI, and VARY indicate levels of corresponding potentials and also indicate potential differences (voltages) from the ground potential VSS. For example, "VDD" indicates a potential level itself of the external potential VDD and also indicates a potential difference (a voltage) from the ground potential VSS. The same holds true for VPP, VPERI, and VARY. In the present embodiment, it is assumed that VPP>VDD>VPERI≈VARY. The internal potential VPP is generated by stepping up the external potential VDD, and the internal potentials VPERI and VARY are generated by stepping down the external potential VDD.

The internal voltage VPP is mainly used in the row decoder 12. The row decoder 12 drives a word line WL selected based on the address signal ADD to a VPP level, thereby bringing cell transistors included in the corresponding memory cells MC into conduction. The internal voltage VARY is used in the sense circuit 14. When activated, the sense circuit 14 drives one of a bit line pair to a VARY level and the other bit line to a VSS level, thereby amplifying the read data DQ that have been read. The internal voltage VPERI is used as an operation voltage for most of peripheral circuits such as the access control circuit 20. Power consumption of the semiconductor device 10 is reduced by using the internal voltage VPERI lower than the external voltage VDD as the operation voltage for these peripheral circuits.

A layout of the semiconductor device 10 according to the present embodiment is explained next.

Figure 2:
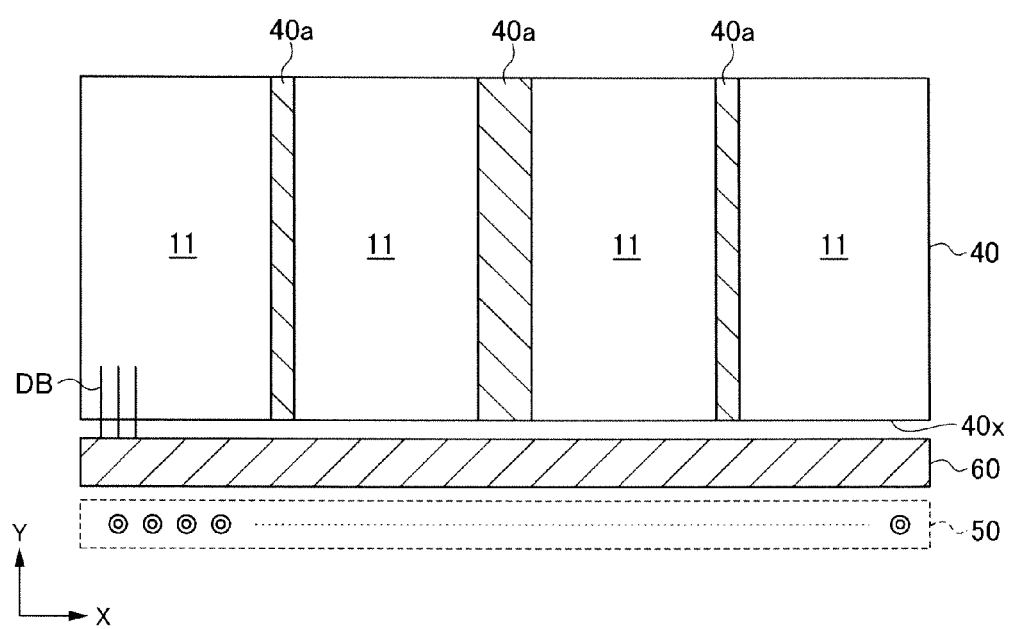
FIG. 2 is a layout diagram of main parts of the semiconductor device 10 shown in FIG. 1

Turning to FIG. 2, the memory cell array 11 is placed in a memory cell area 40. The memory cell area 40 is separated in an X direction by several areas and the separating areas are used as non-array areas 40a. A part of the row decoder 12 and a part of the column decoder 13 shown in FIG. 1 are placed in the non-array areas 40a. A plurality of data buses DB extending in a Y direction are arranged in the X direction above the memory cell area 40.

In a pad area 50 shown in FIG. 2, a plurality of external terminals are arranged in the X direction. Therefore, the address terminal 21, the command terminal 22, the data terminal 23, and the power supply terminals 31 and 32 shown in FIG. 1 are placed in the pad area 50.

In a peripheral circuit area 60 shown in FIG. 2, the amplifier circuit 15 and the power supply circuit 30 shown in FIG. 1 are placed. The peripheral circuit area 60 is located along a side 40x of the memory cell area 40 extending in the X direction to be sandwiched between the memory cell area 40 and the pad area 50.

Figure 3:
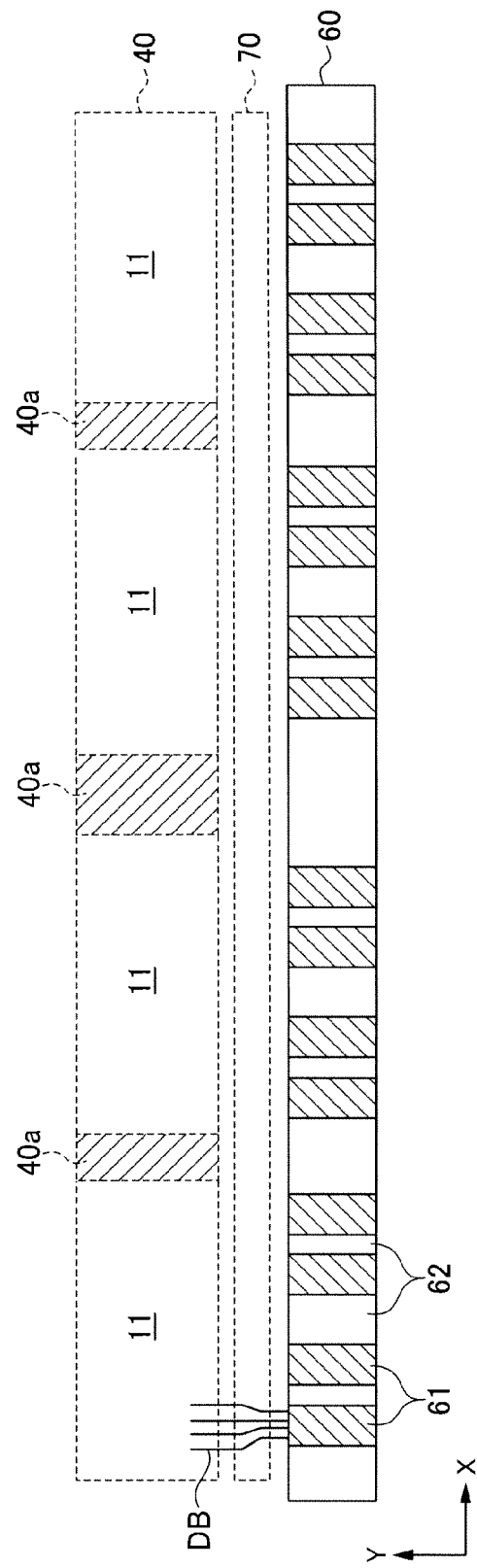
FIG. 3 is a more detailed layout diagram of a peripheral circuit area 60.

Turning to FIG. 3, the peripheral circuit area 60 includes buffer areas 61 and circuit block areas 62. The buffer areas 61 and the circuit block areas 62 are alternately arranged in the X direction. In other words, the buffer areas 61 are separated in the X direction by plural areas and the separating areas are used as the circuit block areas 62. In the present embodiment, a width in the Y direction of the buffer areas 61 is equal to a width in the Y direction of the circuit block areas 62, so that the peripheral circuit area 60 is well shaped as a whole. In the buffer area 61, a plurality of buffer circuits (BC) are arranged. In the circuit block area 62, the circuit blocks such as the internal voltage generating circuit are arranged.

The buffer circuits arranged in the buffer area 61 are connected to corresponding data buses DB, respectively. The data buses DB are lines extending in the Y direction, and an arrangement pitch thereof is relatively large in the memory cell area 40 and relatively small in the buffer areas 61. Such pitch conversion is performed in a pitch conversion area 70 located between the memory cell area 40 and the buffer areas

61. While a width in the Y direction of the pitch conversion area 70 is shown somewhat large in FIG. 3 for the sake of comprehensibility of the drawing, the width in the Y direction can be quite small because the pitch conversion area 70 is practically only an area for shifting positions of the data buses DB in the X direction.

Figure 4:
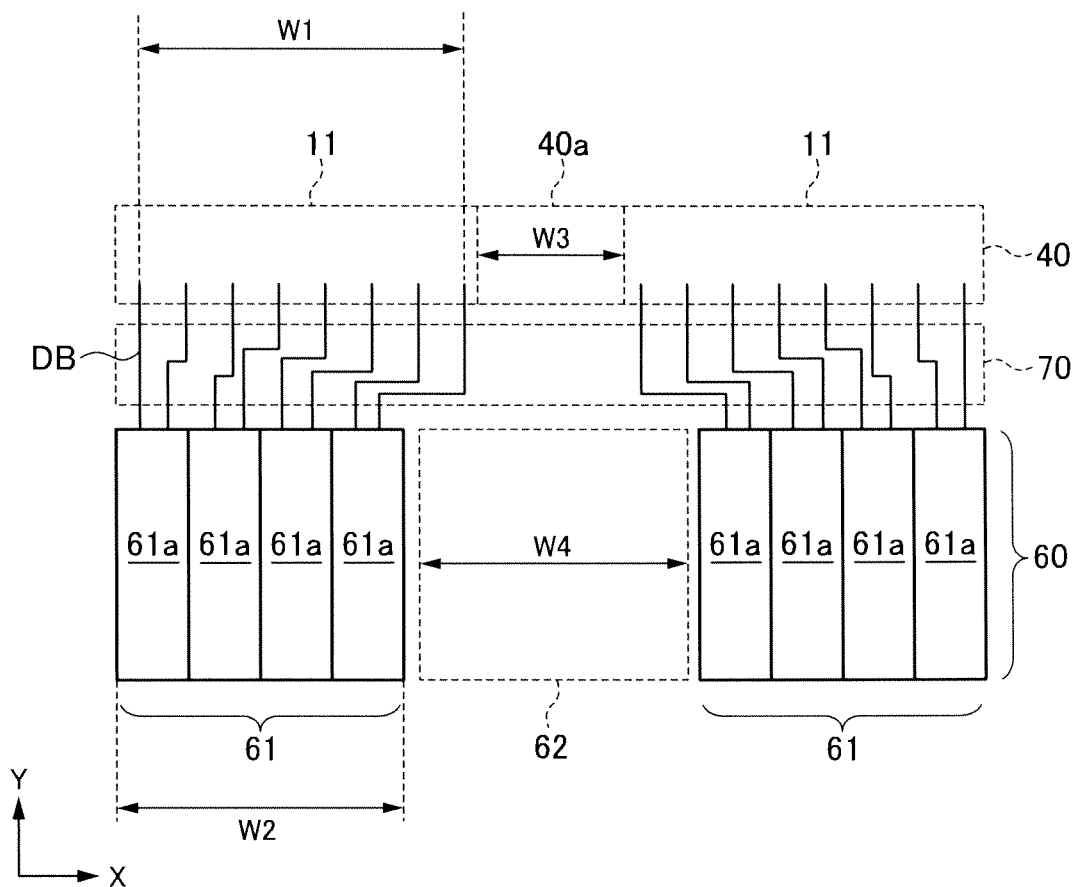
FIG. 4 is a layout diagram for explaining an effect of a pitch conversion area 70.

Turning to FIG. 4, a width in the X direction corresponding to eight data buses DB in the memory cell area 40 is denoted by W1 and a corresponding width in the X direction in the buffer area 61 is denoted by W2. As shown in FIG. 4, the internal arrangement pitch of the data buses DB is converted in the pitch conversion area 70 and thus a relation between the widths W1 and W2 is expressed as the following.

$$W1>W2$$

In this case, reference character 61a in FIG. 4 denotes an area where two buffer circuits are placed. Accordingly, two data buses DB are allocated to the area denoted by 61a.

As a result of the pitch conversion, when a width in the X direction of the non-array area 40a is W3 and a width in the X direction of the circuit block area 62 is W4, the following relation is established.

$$W3<W4$$

That is, a larger width in the X direction can be secured for the circuit block area 62 by reduction in the arrangement pitch of the buffer circuits from the arrangement pitch of the data buses DB. This enables the width in the Y direction of the buffer area 61 and the width in the Y direction of the circuit block area 62 to be nearly matched with each other as shown in FIGS. 3 and 4, so that the peripheral circuit area 60 can be well shaped as a whole.

Figure 5:
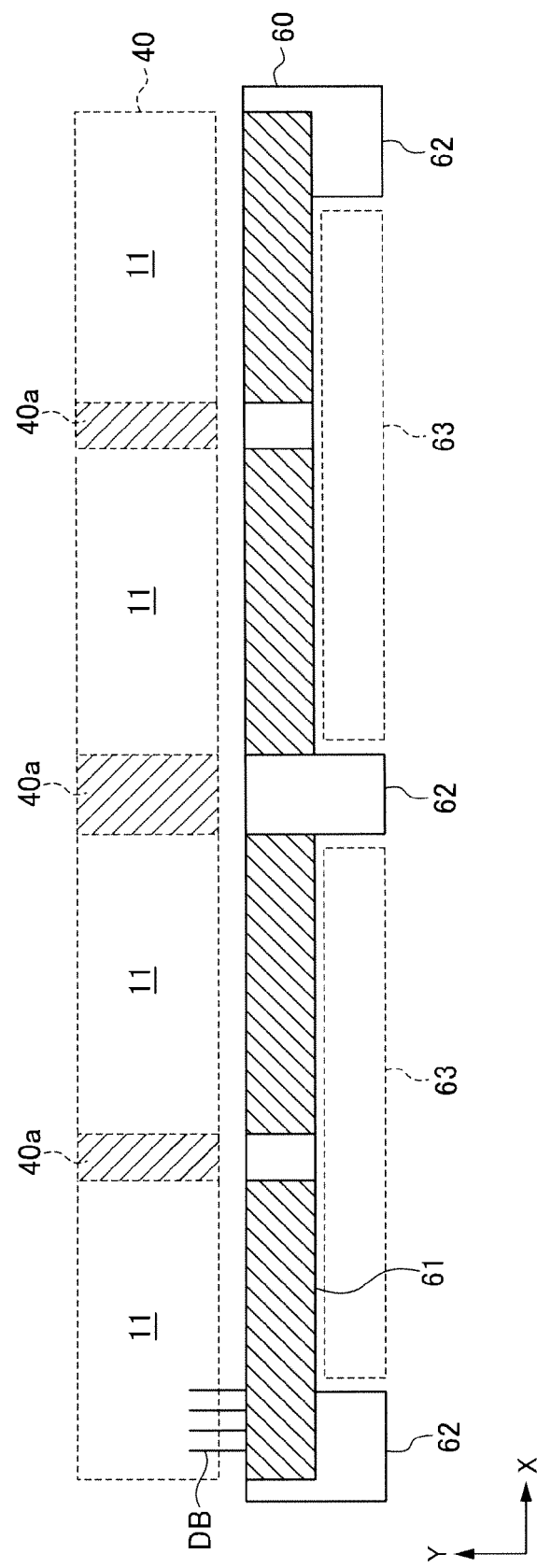
FIG. 5 is a layout diagram of the peripheral circuit area 60 according to a prototype in the course of making the present invention.

Turning to FIG. 5, the prototype in the course of making the present invention shows a layout of a case where the buffer circuits are placed as extensions of the data buses DB in the memory cell area 40. That is, this is an example where an arrangement pitch of the data buses DB in the memory cell area 40 is equal to an arrangement pitch of the buffer circuits in the buffer area 61. In this example, a larger width in the X direction can be secured for one buffer circuit as compared to the example shown in FIG. 3, which narrows the width in the Y direction of the buffer area 61. The pitch conversion area 70 is not required and a space in the Y direction corresponding thereto is unnecessary. However, the width in the Y direction of the pitch conversion area 70 is small as already explained and an effect obtained by eliminating the pitch conversion area 70 is quite minor.

Instead, a width in the X direction of the circuit block area 62 becomes insufficient due to increase in the width in the X direction of the buffer area 61 and, as a result, it becomes impossible to match the width in the Y direction of the buffer area 61 and the width in the Y direction of the circuit block area 62 with each other. This requires that the width in the Y direction of the circuit block area 62 is increased as shown in FIG. 5 to arrange necessary circuit blocks in the circuit block area 62. Accordingly, the peripheral circuit area 60 is irregularly shaped, resulting in useless free spaces 63. These spaces 63 are not favorable because they lead to increase in the chip area.

On the other hand, in the present embodiment, the width in the Y direction of the buffer area 61 and the width in the Y direction of the circuit block area 62 can be almost matched as explained with reference to FIG. 3 and thus almost no useless free spaces 63 are produced. This enables the chip area to be reduced.

Figure 6:
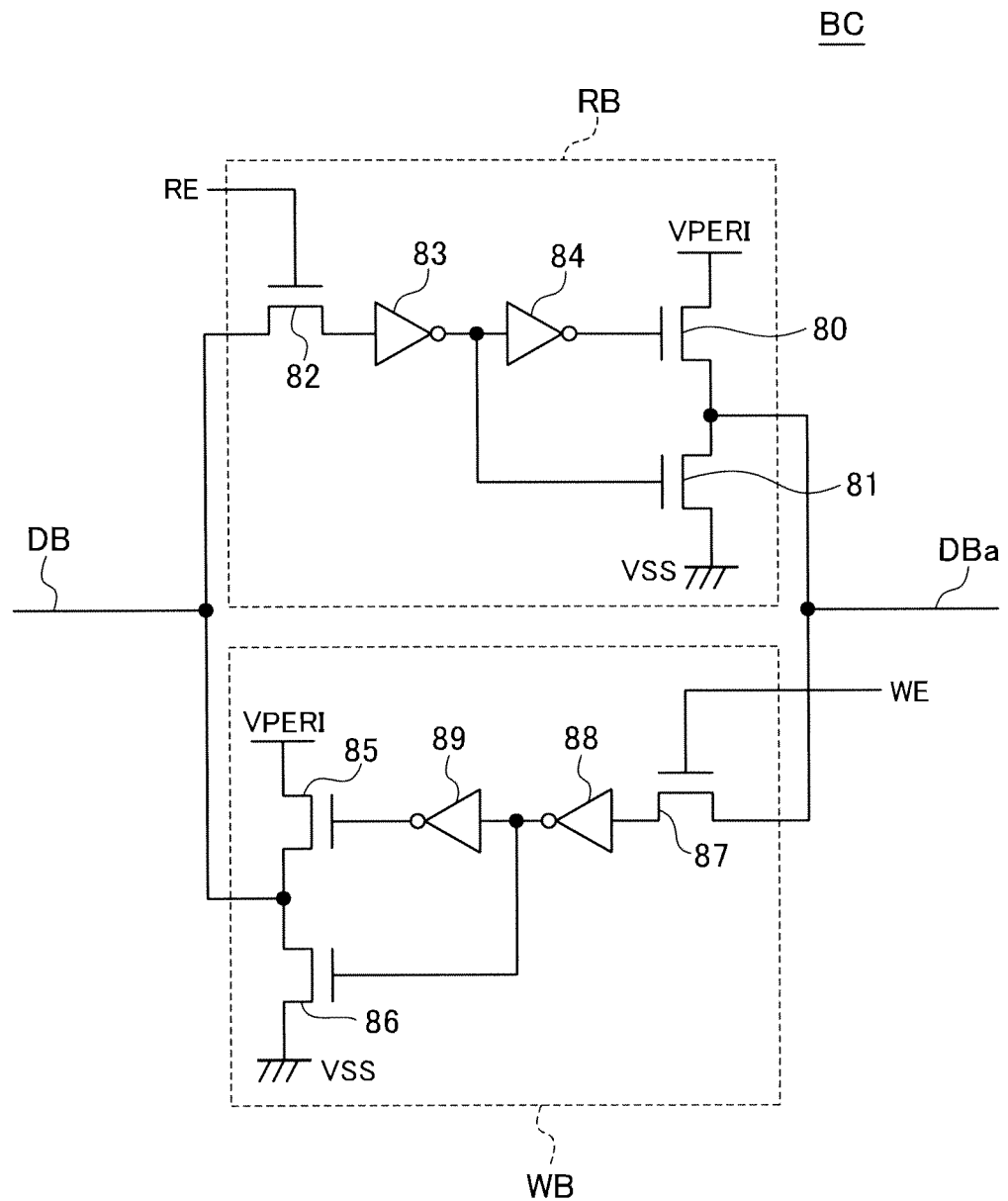
FIG. 6 is a circuit diagram of a buffer circuit BC.

Turning to FIG. 6, the buffer circuit BC includes a read buffer circuit RB that buffers read data supplied via a corresponding data bus DB, and a write buffer circuit WB that buffers write data to be supplied to the corresponding data bus DB. The read data buffered by the read buffer circuit RB is supplied to a data bus DBa and is output to outside through the data terminal 23 shown in FIG. 1. The write data input through the data terminal 23 is supplied to the write buffer circuit WB via the data bus DBa, and the write data buffered by the write buffer circuit WB is supplied to the data bus DB.

The read buffer circuit RB includes N-channel MOS transistors 80 and 81 connected in series between the internal voltages VPERI and VSS, and a connection node of these transistors is connected to the data bus DBa. The read data on the data bus DB is supplied to a gate electrode of the transistor 80 via a read switch 82 and inverters 83 and 84. The read data on the data bus DB is supplied to a gate electrode of the transistor 81 via the read switch 82 and the inverter 83. The read switch 82 includes an N-channel MOS transistor and has a gate electrode supplied with a read enable signal RE.

With this configuration, when the read enable signal RE is activated to a high level, either the transistor 80 or 81 is turned on according to a logic level of the read data on the data bus DB. Specifically, when the read data on the data bus DB is at a high level, the transistor 80 is turned on, so that a high-level signal is output to the data bus DBa. Conversely, when the read data on the data bus DB is at a low level, the transistor 81 is turned on, so that a low-level signal is output to the data bus DBa. Buffering of the read data is performed in this way.

The write buffer WB includes N-channel MOS transistors 85 and 86 connected in series between the internal voltages VPERI and VSS, and a connection node of these transistors is connected to the data bus DB. The write data on the data bus DBa is supplied to the gate electrode of the transistor 85 via a write switch 87 and inverters 88 and 89. The write data on the data bus DBa is supplied to the gate electrode of the transistor 86 via the write switch 87 and the inverter 88. The write switch 87 includes an N-channel MOS transistor and has the gate electrode supplied with a write enable signal WE.

With this configuration, when the write enable signal WE is activated to a high level, either the transistors 85 or 86 is turned on according to a logic level of the write data on the data bus DBa. Specifically, when the write data on the data bus DBa is at a high level, the transistor 85 is turned on, so that a high-level signal is output to the data bus DB. Conversely, when the write data on the data bus DBa is at a low level, the transistor 86 is turned on, so that a low-level signal is output to the data bus DB. Buffering of the write data is performed in this way.

In this manner, the buffer circuit BC includes the read buffer circuit RB and the write buffer circuit WB, and one buffer circuit BC is provided for one data bus DB. As described above, the buffer circuits BC are laid out in the buffer area 61.

Figure 7:
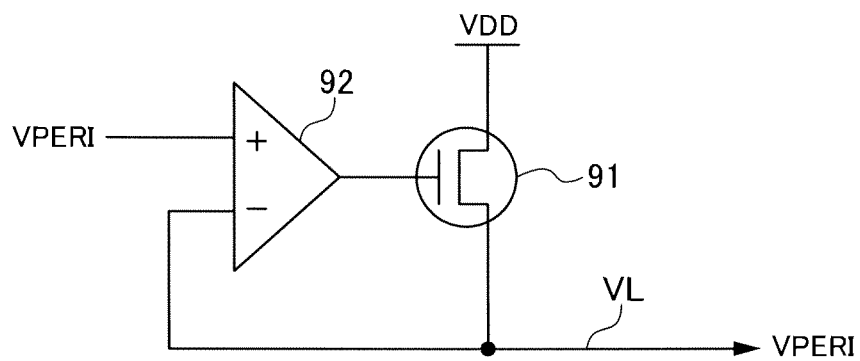
FIG. 7 is a circuit diagram indicative of an example of the circuit block laid out in a circuit block area 62.

Turning to FIG. 7, the circuit block generates the internal voltage VPERI, and includes a driver circuit 91 including a P-channel MOS transistor connected between the external potential VDD and an internal power supply line VL, and a comparator 92 that controls the driver circuit 91. The inverting input node (−) of the comparator 92 is connected to the internal power supply line VL, and the internal voltage VPERI used as a reference is supplied to the non-inverting input node (+) thereof. The output of the comparator 92 is supplied to the gate electrode of the transistor included in the driver circuit 91. With this configuration, the level of the internal power supply line VL is driven to the internal voltage VPERI.

Figure 8:
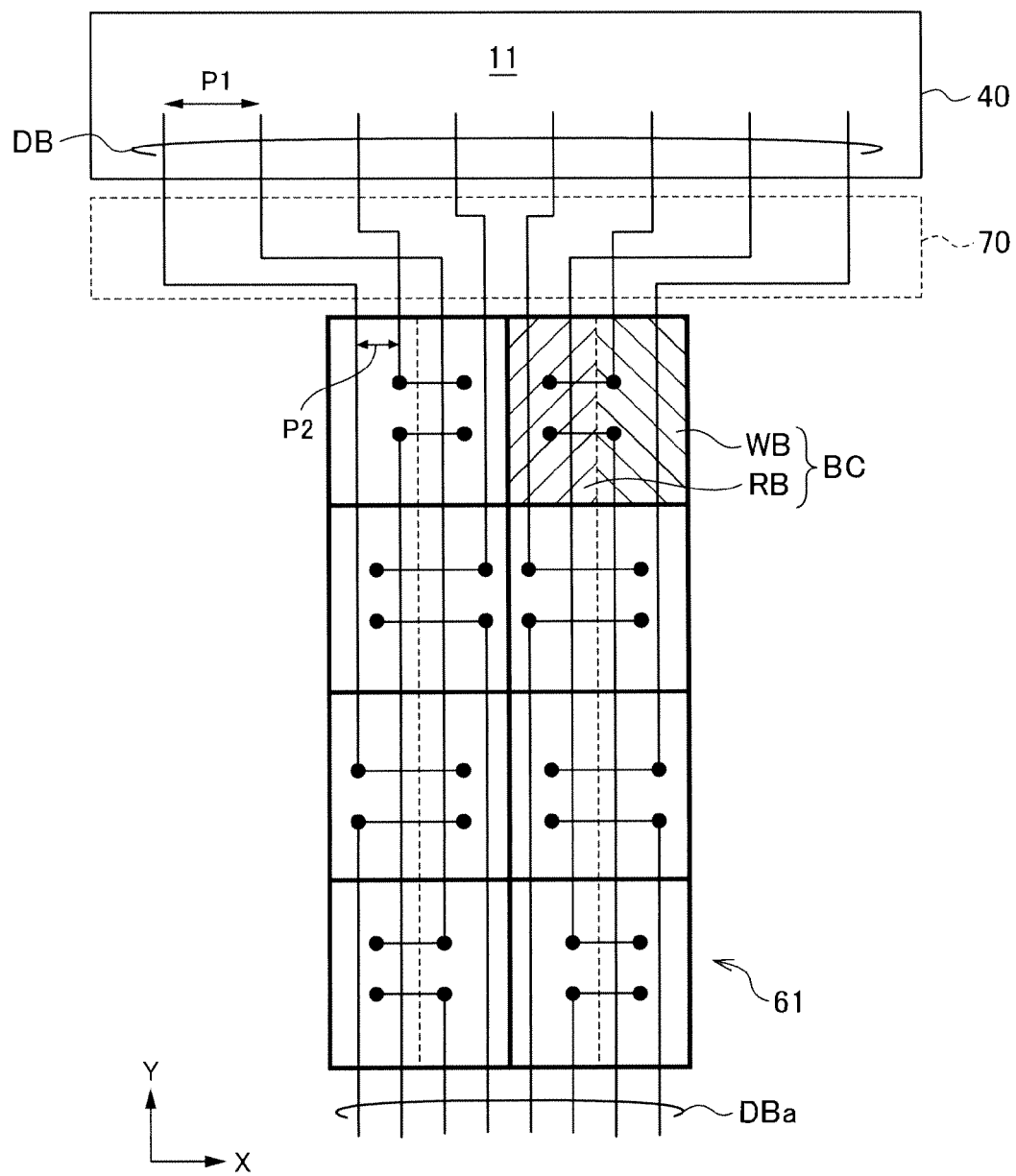
FIG. 8 is a schematic diagram for explaining an example of a layout of the buffer circuits BC in a buffer area 61.

FIG. 8 shows a layout of eight buffer circuits BC. In an area shown by a heavy line in FIG. 8, one buffer circuit BC is placed. Therefore, an example shows that four buffer circuits BC are arranged in the Y direction in the buffer area 61. Among each of the buffer circuits BC, the read buffer circuit RB is formed in an area with hatching rising to the right and the write buffer circuit WB is formed in an area with hatching rising to the left.

In the example shown in FIG. 8, the arrangement pitch in the X direction of the data buses DB extending in the Y direction from the memory cell area 40 is reduced from P1 to P2 in the pitch conversion area 70 and then the data buses DB are connected to the buffer area 61. Each of the data buses DB is connected to one of the read buffer circuit RB and the write buffer circuit WB that constitute the corresponding buffer circuit BC via a wiring part extending in the Y direction, and is connected to the other of the read buffer circuit RB and the write buffer circuit WB via a wiring part extending in the X direction. Two data buses DB or DBa extend in the Y direction in the areas where the read buffer circuit RB is formed, respectively, and similarly two data buses DB or DBa extend in the Y direction in the areas where the write buffer circuit WB is formed, respectively.

The data buses DB or DBa extending in the Y direction in the buffer area 61 are connected to the corresponding buffer circuits BC, respectively, and are not connected to non-corresponding buffer circuits BC. Therefore, the data buses DB or DBa extending in the Y direction need to pass over the non-corresponding buffer circuits BC in the Y direction and, to achieve this, a passing line area that enables the data buses DB or DBa to pass through in the Y direction is formed in each of the buffer circuits BC.

Figure 9:
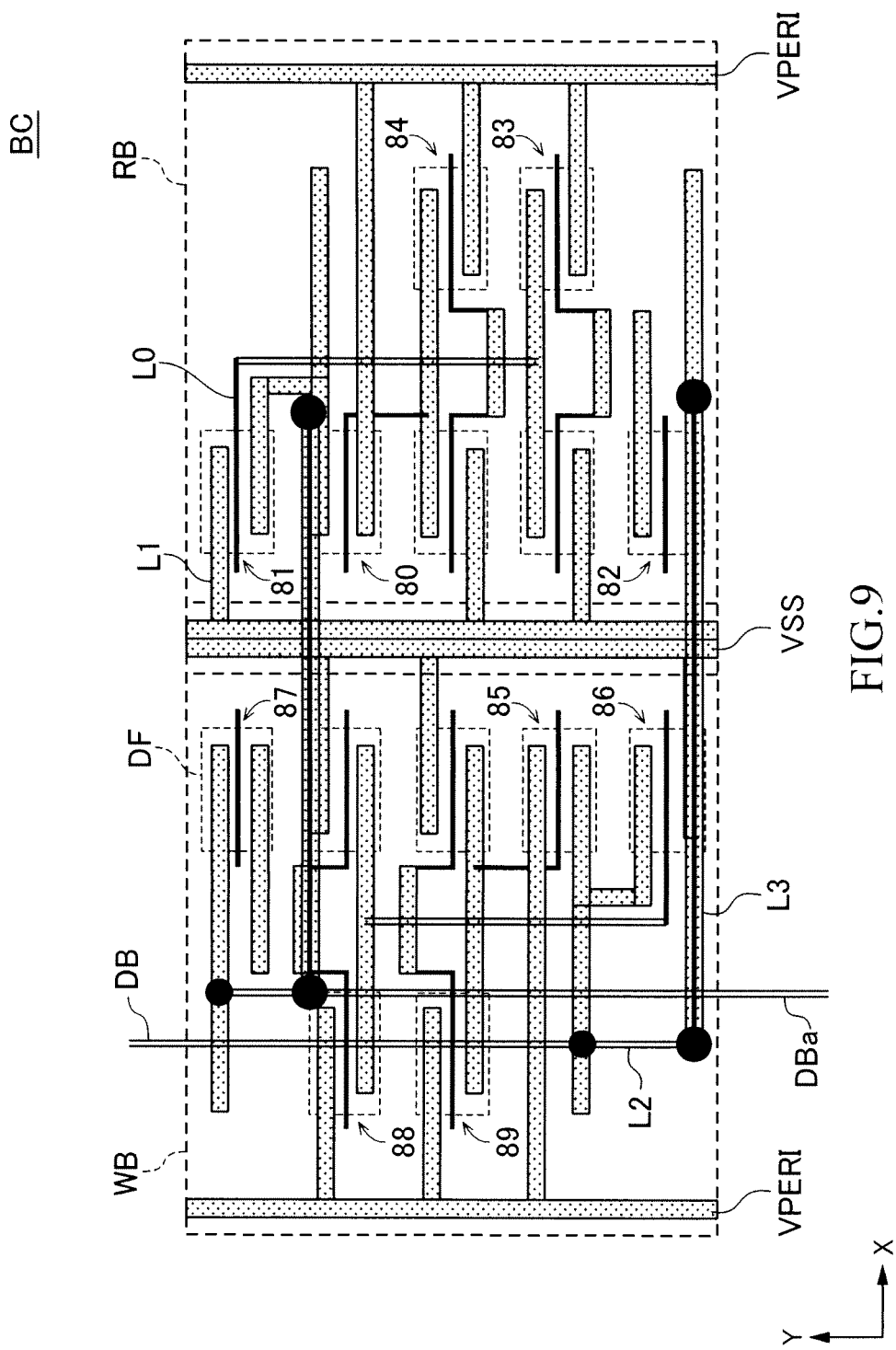
FIG. 9 is a plan view showing the layout of the buffer circuit BC shown in FIG. 8 in more detail.

In an example shown in FIG. 9, out of the read buffer circuit RB and the write buffer circuit WB placed side by side in the X direction, the read buffer circuit RB is located on the right and the write buffer circuit WB is located on the left. A power supply line supplied with the internal voltage VSS extends in the Y direction between the read buffer circuit RB and the write buffer circuit WB. A power supply line supplied with the internal voltage VPERI extends in the Y direction on the right side of the read buffer circuit RB and a power supply line supplied with the internal voltage VPERI also extends in the Y direction on the left side of the write buffer circuit WB. This causes each of the read buffer circuit RB and the write buffer circuit WB to be placed between the power supply line supplied with the internal voltage VSS and the power supply line supplied with the internal voltage VPERI.

In FIG. 9, an element denoted by reference character DF is a diffusion layer area that constitutes a transistor, an element denoted by reference character L0 is a gate electrode, and elements denoted by reference character L1 to L3 are first to third wiring layers, respectively. Among these, the second wiring layer L2 is used for wiring extending in the Y direction and the third wiring layer L3 is used for wiring extending in the X direction. That is, the second writing layer L2 is used for the data buses DB and DBa extending in the Y direction. The third wiring layer L3 is used for a connection line that connects the read buffer circuit RB and the write buffer circuit WB, and the connection line is placed to intersect with the power supply line supplied with the internal voltage VSS.

In this manner, because the read buffer circuit RB and the write buffer circuit WB are connected by using the third wiring layer L3 in the example shown in FIG. 9, the arrangement pitch in the X direction of the data buses DB or DBa extending in the Y direction can be reduced while the read buffer circuit RB and the write buffer circuit WB are placed side by side in the X direction.

Figure 10:
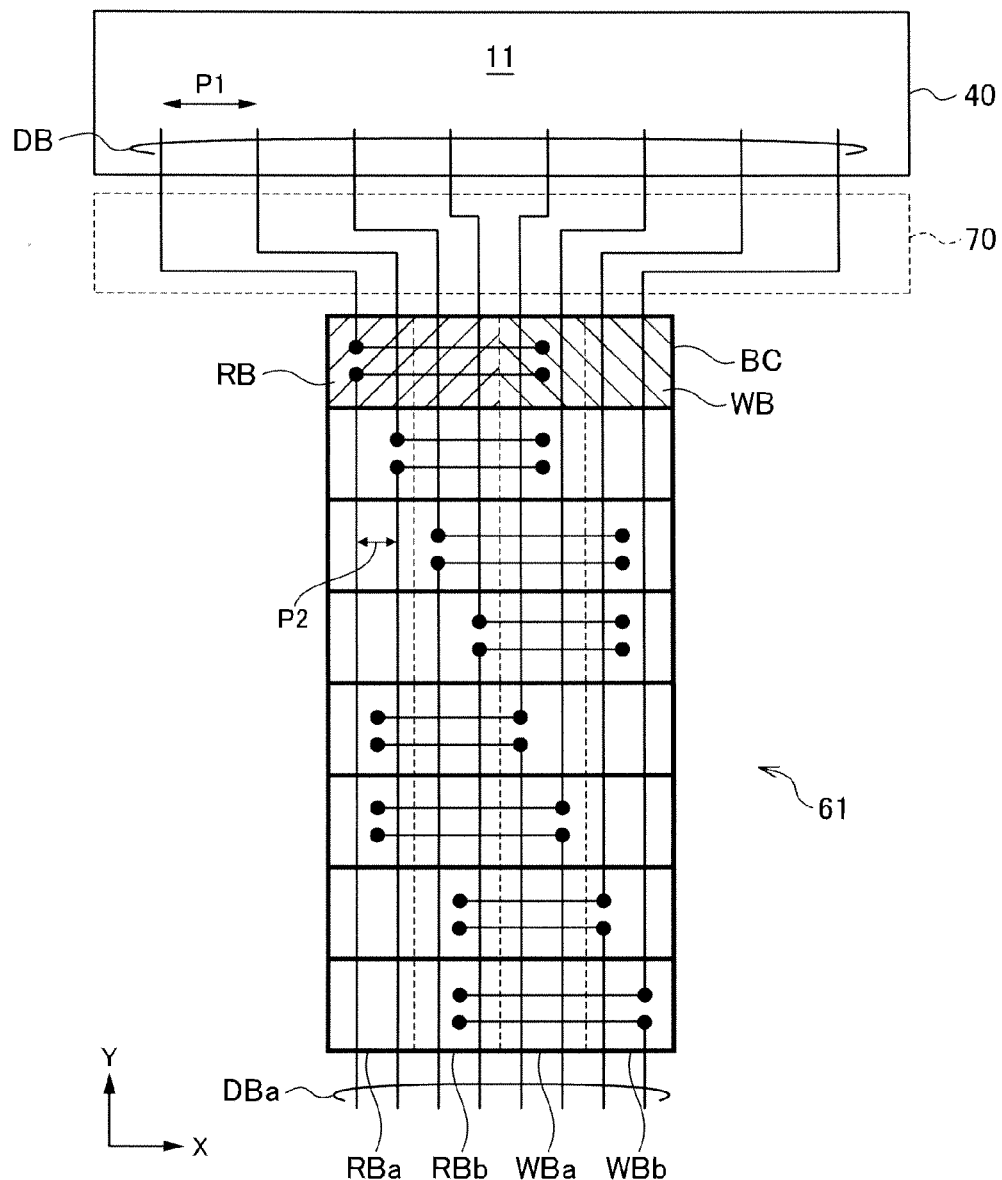
FIG. 10 is a schematic diagram for explaining another example of the layout of the buffer circuits BC in the buffer area 61.

Turning to FIG. 10, one buffer circuit BC is placed in an area shown by a heavy line. Therefore, in the present example, eight buffer circuits BC are arranged in the Y direction in the buffer area 61. Among each of the buffer circuits BC, the read buffer circuit RB is formed in an area with hatching rising to the right and the write buffer circuit WB is formed in an area with hatching rising to the left. The read buffer circuit RB is divided into two areas RBa and RBb arranged side by side in the X direction and the write buffer circuit WB is also divided into two areas WBa and WBb arranged side by side in the X direction, which will be explained in detail later.

Also in the example shown in FIG. 10, the arrangement pitch in the X direction of the data buses DB extending in the Y direction from the memory cell area 40 is reduced from P1 to P2 in the pitch conversion area 70 and then the data buses DB are connected to the buffer area 61. Each of the data buses DB is connected to one of the read buffer circuit RB and the write buffer circuit WB that constitute the corresponding buffer circuit BC via a wiring part extending in the Y direction, and is connected to the other of the read buffer circuit RB and the write buffer circuit WB via a wiring part extending in the X direction. Two data buses DB or DBa extend in the Y direction in each of the areas RBa, RBb, WBa, and WBb.

Similarly in the example shown in FIG. 8, the data buses DB or DBa extending in the Y direction in the buffer area 61 are connected to the corresponding buffer circuits BC, respectively, and are not connected to non-corresponding buffer circuits BC. Therefore, the data buses DB or DBa extending in the Y direction need to pass over the non-corresponding buffer circuits BC in the Y direction and, to achieve this, each of the buffer circuits BC has a passing line area that enables the data buses DB or DBa to pass through in the Y direction.

Figure 11:
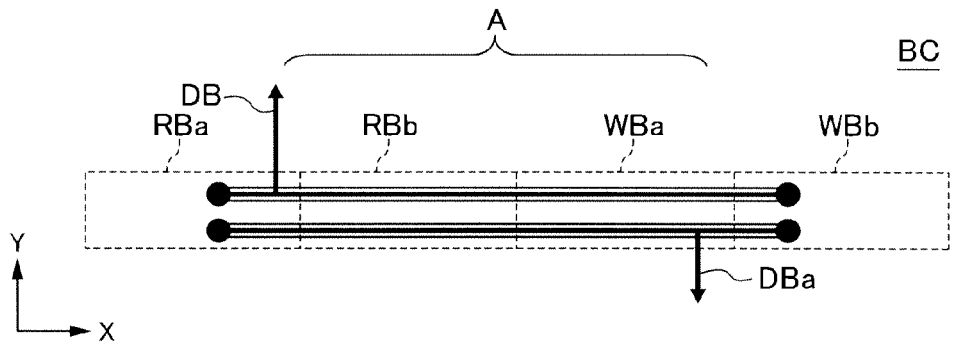
FIG. 11 is a plan view indicative of the layout of the buffer circuit BC shown in FIG. 10 in an enlarged manner.

In an example shown in FIG. 11, a total of four areas, that is, the two areas RBa and RBb constituting the read buffer circuit RB and the two areas WBa and WBb constituting the write buffer circuit WB are arranged side by side in the X direction in this order. Lines extending in the Y direction shown in FIG. 11 use the second wiring layer L2 shown in FIG. 9 and lines extending in the X direction use the third wiring layer L3 shown in FIG. 9. That is, as in the example shown in FIG. 9, the second wiring layer L2 is used for the data buses DB and DBa extending in the Y direction and the third wiring layer L3 is used for the connection line that connects the read buffer circuit RB and the write buffer circuit WB.

Figure 12:
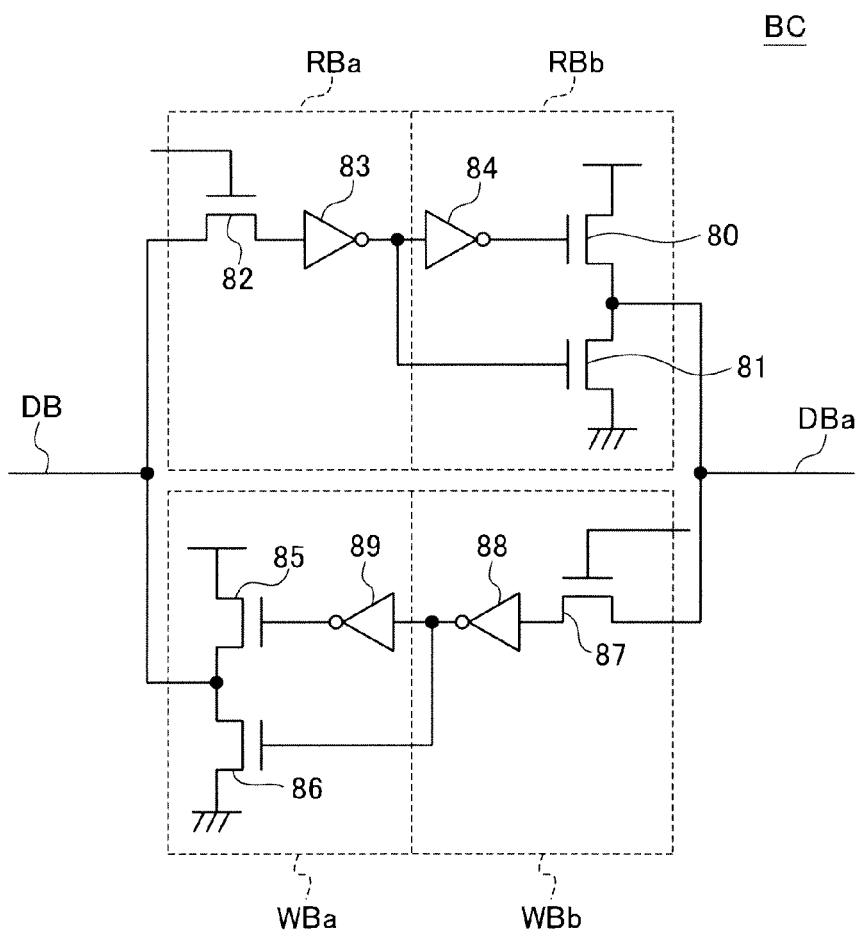
FIG. 12 is circuit diagram showing the buffer circuit BC including four areas RBa, RBb, WBa, and WBb.

Turning to FIG. 12, the read switch 82 and the inverter 83 constituting the read buffer circuit RB are placed in the area RBa, and the transistors 80 and 81 and the inverter 84 constituting the read buffer circuit RB are placed in the area RBb. The transistors 85 and 86 and the inverter 89 constituting the write buffer circuit WB are placed in the area WBa, and the write switch 87 and the inverter 88 constituting the write buffer circuit WB are placed in the area WBb.

In this manner, because the buffer circuit BC is placed dividedly in the four areas in the present example, each buffer circuit BC has a layout with a width longer in the X direction and a width smaller in the Y direction. In the present example, eight data buses DB or DBa pass through in the Y direction over one buffer circuit BC in the Y direction; however, a sufficient passing line area for the data buses DB or DBa to pass through in the Y direction can be secured because each of the buffer circuits BC has the layout with the width longer in the X direction as described above. For example, an area A shown in FIG. 11 serves as the passing line area.

Figure 13A:
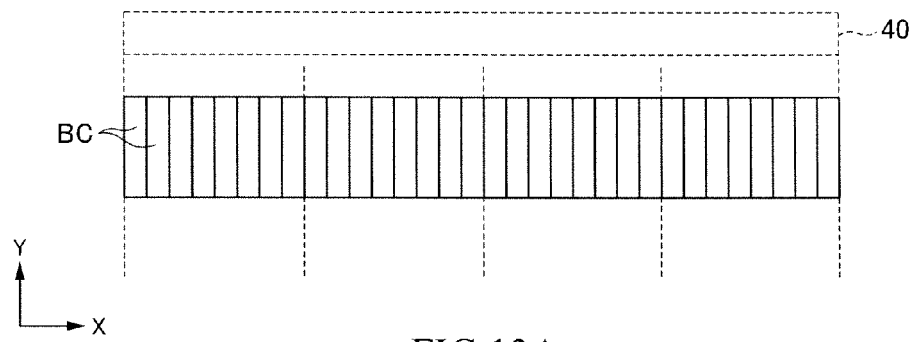
FIG. 13A is a schematic diagram indicative of a layout of the prototype.
Figure 13B:
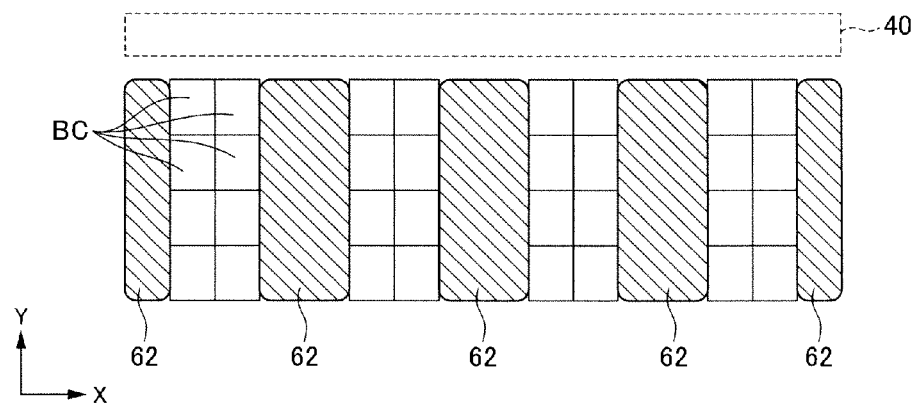
FIG. 13B is a schematic diagram showing the layout of the buffer circuit BC and the circuit block areas 62 according to the embodiment.

As shown in FIG. 13A, in the layout of the prototype, the buffer circuits BC are arranged without any space therebetween along a side in the X direction of the memory cell area 40, which prevents placement of other circuit blocks. In contrast, in the layout according to the present embodiment, a plurality of (four, for example) buffer circuits BC are arranged side by side in the Y direction as shown in FIG. 13B, which enables the circuit block areas 62 placed between the buffer circuits BC. Accordingly, the width in the Y direction of the buffer area 61 becomes slightly larger; however, the widths in the Y direction of the buffer area 61 and the circuit block area 62 can be almost matched with each other, so that the peripheral circuit area 60 can be well shaped as a whole, which contributes to reduction in the chip area.

Figure 14A:
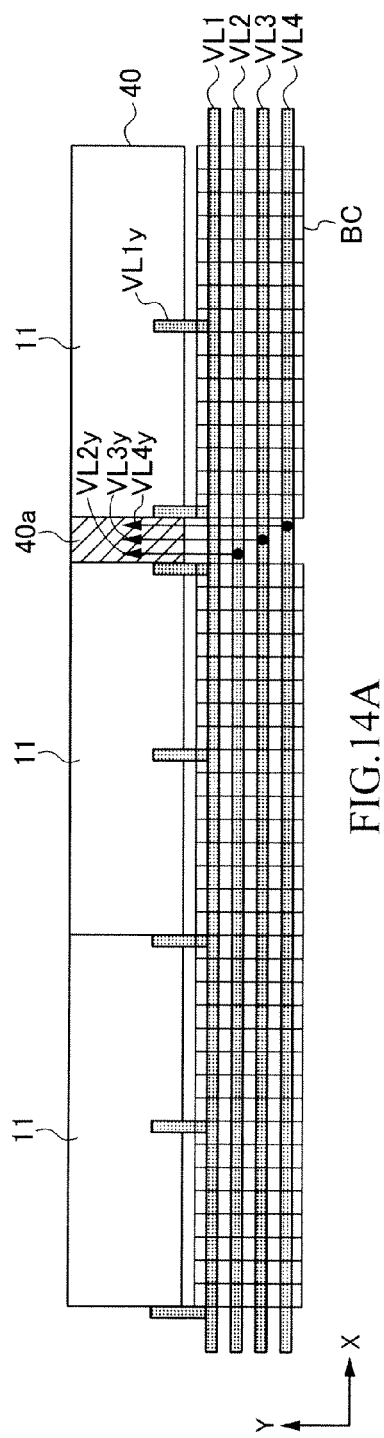
FIG. 14A is a schematic diagram indicative of a layout of the prototype.
Figure 15:
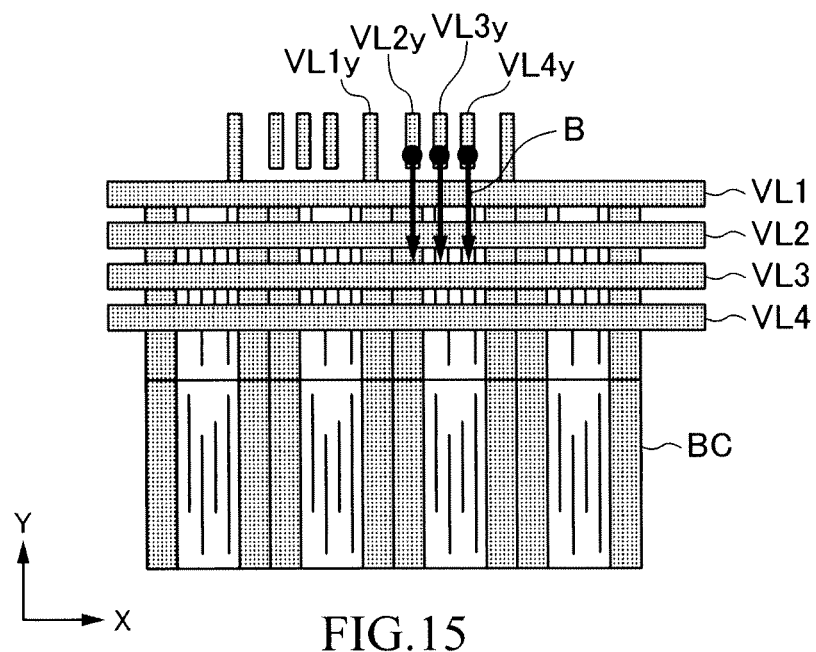
FIG. 15 is an enlarged view of a main part of a layout shown in FIG. 14A.

As shown in FIG. 14A, in the layout of the prototype, the buffer circuits BC are arranged without any space therebetween along the side in the X direction of the memory cell area 40, and accordingly an internal power supply line VL1 closest to the memory cell area 40 among internal power supply lines VL1 to VL4 passing over the buffer circuits BC in the X direction can be branched in the Y direction into a branch line VL1y at arbitrary positions while the other internal power supply lines VL2 to VL4 cannot be branched in the Y direction into branch lines VL2y to VL4y at arbitrary positions. This is because other internal power supply lines and the data buses DB are arranged to extend in the Y direction in the area where the buffer circuits BC are arranged and there is no space to form the branch lines VL2y to VL4y in the Y direction. Therefore, branching of the branch lines VL2y to VL4y is possible only in the non-array area 40a. This means that layouts of the internal power supply lines VL2 to VL4 are limited, which leads to increase in resistances of the internal power supply lines VL2 to VL4. This is shown in more detail by an enlarged view in FIG. 15, where the branch lines VL2y to VL4y cannot be connected at a position denoted by reference character B.

Figure 14B:
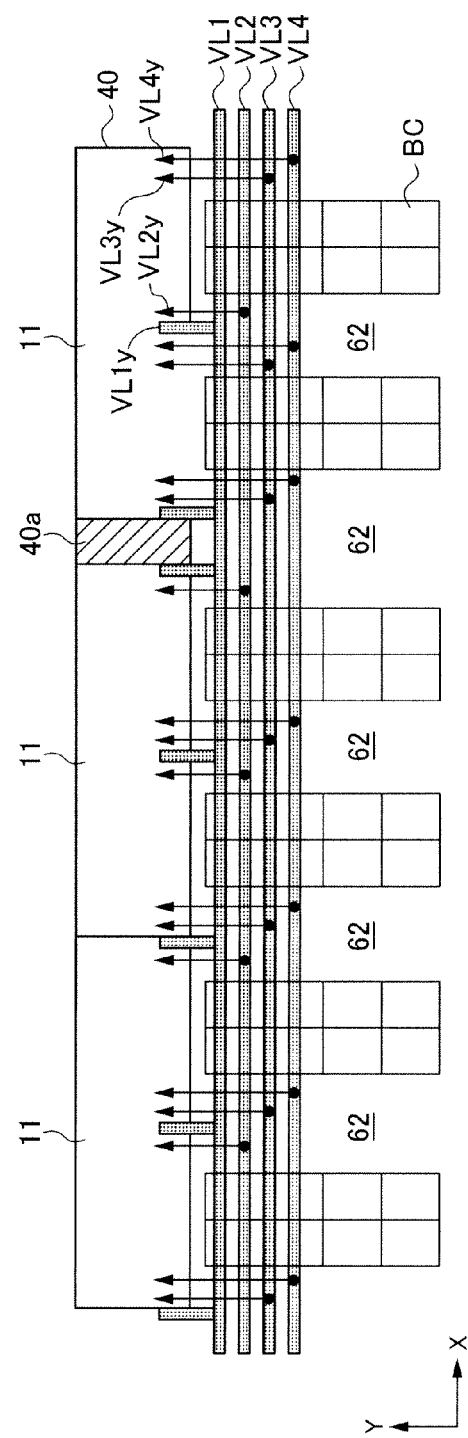
FIG. 14B is a schematic diagram for explaining an effect according to the embodiment.
Figure 16:
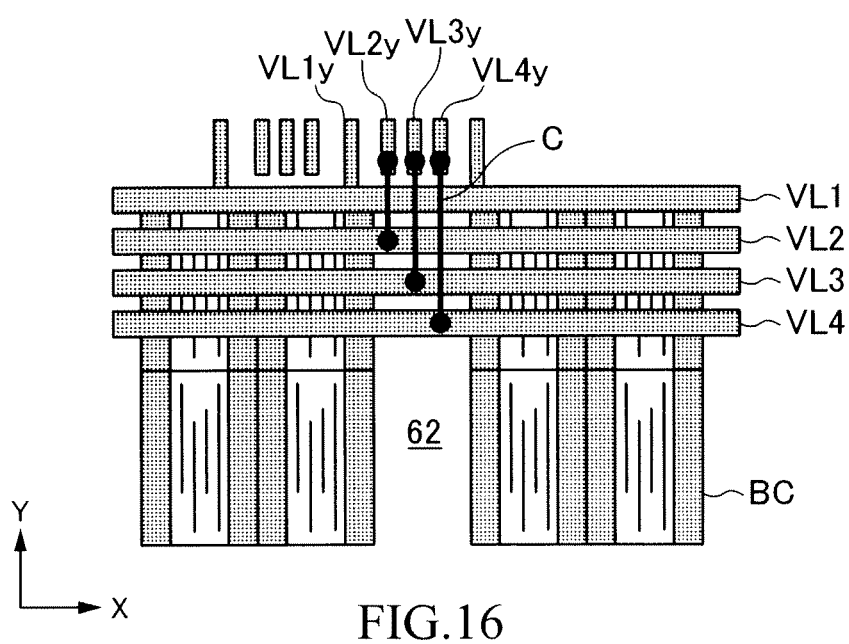
FIG. 16 is an enlarged view of a main part of a layout shown in FIG. 14B.

On the other hand, in the layout according to the present embodiment, the circuit block area 62 can be dispersedly placed also at positions other than a position corresponding to the non-array area 40a as shown in FIG. 14B, which enables the branch lines VL1y to VL4y to be densely arranged. Accordingly, resistances of the internal power supply lines VL1 to VL4 can be decreased. This is shown in more detail by an enlarged view in FIG. 16, where the branch lines VL2y to VL4y can be connected at a position denoted by reference character C.

As shown in FIG. 17A, positions in the X direction of the circuit block areas 62 and the non-array areas 40a are the same in the layout of the prototype. Accordingly it is necessary to pass through a route R1 from a power supply circuit PW, for example, to supply an internal voltage generated in the circuit block area 62 to the memory cell array 11, which increases a resistance of a power supply line. In contrast, in the layout according to the present embodiment shown in FIG. 17B, the circuit block areas 62 can be placed at arbitrary positions, which enables an internal voltage to be supplied from a power supply circuit PW by a most direct way through a route R2, for example. This decreases a resistance of a power supply line and thus the internal voltage can be stably supplied. Besides, because many power supply circuits PW can be dispersedly placed, sizes of elements such as a transistor that constitute the power supply circuits PW can be reduced.

As shown in FIG. 18A, in the layout of the prototype, when control signals for controlling areas 11a and 11b in the memory cell array 11 are generated by control circuits CT in the circuit block area 62, a signal path for controlling the area 11a and a signal path for controlling the area 11b naturally have different lengths. Accordingly, a control timing for the area 11a and a control timing for the area 11b become different, so that a control margin is reduced. In contrast, in the layout according to the present embodiment, positions of control circuits CT can be selected to match lengths of a signal path for controlling the area 11a and a signal path for controlling the area 11b as shown in FIG. 18B. Accordingly, a control timing for the area 11a and a control timing for the area 11b can be matched with each other, thereby increasing a control margin.

Figure 19:
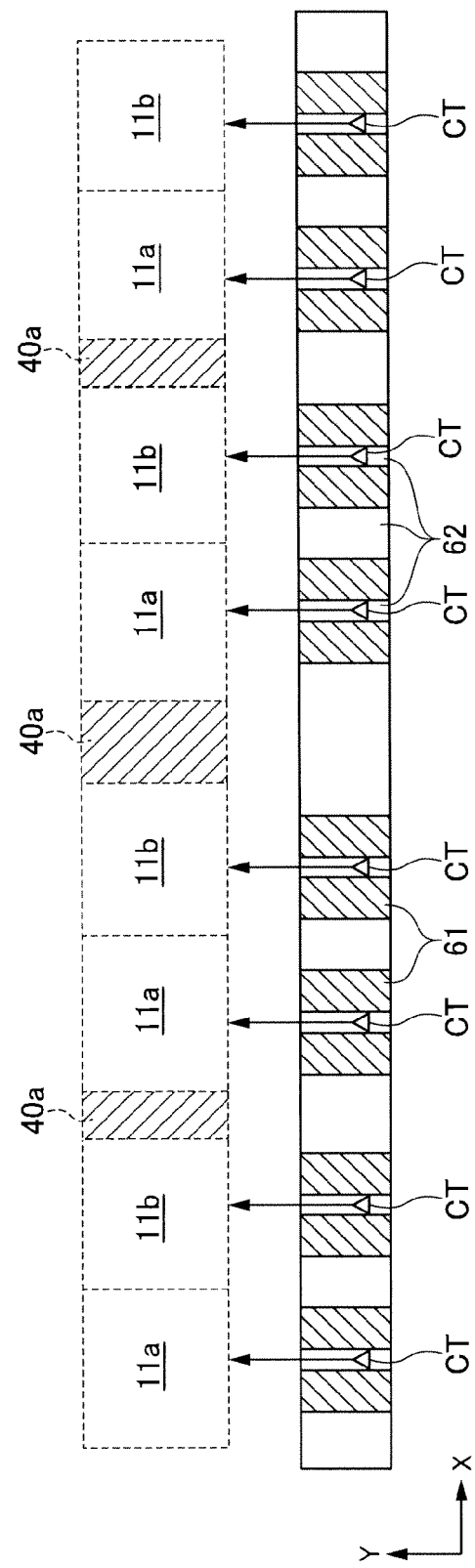
FIG. 19 is a schematic diagram for explaining still another effect according to the embodiment.

Alternatively, in the present embodiment, the control circuits CT can be divided into ones for controlling the areas 11a and ones for controlling the areas 11b as shown in FIG. 19. In this case, different controls can be performed in the areas 11a and the areas 11b. As examples of the different controls, it is conceivable that power supply to the areas 11b is stopped while activating the areas 11a to reduce current consumption or that a control timing for the areas 11a and a control timing for the areas 11b are arbitrarily differentiated.

As shown in FIG. 20A, in the layout of the prototype, when control signals are buffered in buffers B in the circuit block area 62, the number of buffers B is greatly limited. In contrast, in the layout according to the present embodiment shown in FIG. 20B, many buffers B can be dispersedly placed. Therefore, a transmission speed can be increased and also the transmission speed can be finely adjusted by designing.

What is claimed is:
1. A semiconductor device comprising:
 a plurality of data buses each extending in a first direction;
 a memory cell area having a first side extending in a second direction different from the first direction;
 a buffer area located along the first side of the memory cell area, the buffer area including a plurality of buffer circuits each connected to an associated one of the data buses, wherein
 each of the data buses has a first portion located over the memory cell area and a second portion located over the buffer area,
 the first portions of the data buses are arranged at a first pitch in the second direction,
 the second portions of the data buses are arranged at a second pitch in the second direction, and
 the second pitch is smaller than the first pitch; and
 a pad area in which a plurality of external terminals are arranged in the second direction,
 wherein the buffer area is located between the memory cell area and the pad area.

2. The semiconductor device as claimed in claim 1, further comprising a pitch conversion area that is located between the memory cell area and the buffer area,
 wherein a pitch of the data buses in the second direction is converted from the first pitch into the second pitch over the pitch conversion area.

3. The semiconductor device as claimed in claim 1, wherein the plurality of buffer circuits include first and second buffer circuits arranged in the first direction in the buffer area.

4. The semiconductor device as claimed in claim 3, wherein
 the plurality of data buses includes first and second data buses,
 the first and second buffer circuits are connected to the first and second data buses, respectively,
 the first and second buffer circuits are arranged at first and second area in the buffer area, respectively,
 the first area has a first passing area that allows to pass the second data bus in the first direction, and
 the second area has a second passing area that allows to pass the first data bus in the first direction.

5. The semiconductor device as claimed in claim 1, further comprising first to third power supply lines extending in the first direction over the buffer area,
   wherein each of the buffer circuits includes a first circuit part located between the first and second power supply lines, a second circuit part located between the second and third power supply lines, and a connection line that extends in the second direction so as to intersect with the second power supply line and connects the first and second circuit parts with each other.

6. The semiconductor device as claimed in claim 5, wherein the first and third power supply lines are supplied with the substantially same potential as each other.

7. A semiconductor device comprising:
   a plurality of data buses each extending in a first direction;
   a memory cell area having a first side extending in a second direction different from the first direction; and
   a buffer area located along the first side of the memory cell area, the buffer area including a plurality of buffer circuits each connected to an associated one of the data buses, wherein
   each of the data buses has a first portion located over the memory cell area and a second portion located over the buffer area,
   the first portions of the data buses are arranged at a first pitch in the second direction,
   the second portions of the data buses are arranged at a second pitch in the second direction, and
   the second pitch is smaller than the first pitch,
   wherein each of the buffer circuits includes a read buffer circuit that performs a buffering operation of a read data supplied from the memory area via the associated one of the data buses, and a write buffer circuit that performs a buffering operation of a write data to be supplied to the memory cell area via the associated one of the data buses.

8. A semiconductor device comprising:
   a plurality of data buses each extending in a first direction;
   a memory cell area having a first side extending in a second direction different from the first direction;
   a buffer area located along the first side of the memory cell area, the buffer area including a plurality of buffer circuits each connected to an associated one of the data buses, wherein
   each of the data buses has a first portion located over the memory cell area and a second portion located over the buffer area,
   the first portions of the data buses are arranged at a first pitch in the second direction,
   the second portions of the data buses are arranged at a second pitch in the second direction, and
   the second pitch is smaller than the first pitch; and
   a plurality of circuit blocks each includes at least an internal voltage generating circuit that generates an internal voltage,
   wherein each of the circuit blocks are arranged between two buffer areas in the second direction.

9. The semiconductor device as claimed in claim 8, wherein the buffer areas and the circuit blocks have the substantially same width as one another in the first direction.

10. The semiconductor device as claimed in claim 8, further comprising an internal power supply line supplied with the internal voltage,
    wherein the internal power supply line extends in the second direction so as to pass over the buffer circuits.

11. The semiconductor device as claimed in claim 10, wherein the internal power supply line is branched in the first direction over each of the circuit blocks.

12. A semiconductor device comprising:
    a plurality of buffer circuits each including first and second circuit nodes that are disposed substantially in line in a first direction;
    a plurality of first signal lines arranged at a first pitch in a second direction that is substantially perpendicular to the first direction, each of the first signal lines being elongated from the first circuit node of associated one of the buffer circuits and running in the first direction on a side opposite to the second circuit node;
    a plurality of second signal lines arranged at the first pitch in the second direction, each of the second signal lines being elongated from the second circuit node of an associated one of the buffer circuits and running in the first direction on a side opposite to the first circuit node;
    a plurality of third signal lines arranged at a second pitch in the second direction, the second pitch being greater than the first pitch, each of the third signal lines running in the first direction; and
    a plurality of fourth signals each disposed between an associated one of the second signal lines and an associated one of the third signal lines to connect the associated one of the second signal lines and the associated one of the third signal lines to each other.

13. The device as claimed in claim 12, wherein each of the fourth signal lines bends to connect the associated one of the second signal lines and the associated one of the third signal lines to each other.

14. The device as claimed in claim 13, wherein each of the fourth signal lines comprises:
    a first portion extending in the first direction from an associated one of the second signal lines,
    a second portion extending in the second direction from the first portion, and
    a third portion extending in the first direction from the second portion and reaching an associated one of the third signal lines.

15. The device as claimed in claim 14, wherein the device further comprises a multi-level wiring structure including a lower-level wiring, a upper-level wiring and an interlayer insulating film between the lower-level wiring and the upper-level wiring, each of the First and third portions being formed as one of the lower-level wiring and the upper-level wiring, and the second portion being formed as the other of the lower-level wiring and the upper-level wiring.

16. The device as claimed in claim 12, wherein each of the buffer circuits comprises a first buffer that drives the first circuit node in response to a first signal supplied to the second circuit node and a second buffer that drives the second circuit node in response to a second signal supplied to the first circuit node.

17. The device as claimed in claim 16, further comprising a plurality of memory cells each coupled to an associated one of the third signal lines, a plurality of first data signals read out from the memory cells being supplied to the second circuit nodes of the buffer circuits, and a plurality of second data signals to be written respectively into the memory cells being supplied to the first circuit nodes of the buffer circuits.

18. The device as claimed in claim 12, wherein the buffer circuits are arranged in a plurality of rows and columns.

19. The device as claimed in claim 12, wherein the buffer circuits are arranged in line in the first direction.

* * * * *